United States Patent
Jeong et al.

[11] Patent Number: 5,807,728
[45] Date of Patent: Sep. 15, 1998

[54] THIN FILM TRANSISTOR FOR ANTISTATIC CIRCUIT AND METHOD FOR FABRICATING THE SAME

[75] Inventors: Jae Goan Jeong; Gun Woo Park, both of Ichon-shi, Rep. of Korea

[73] Assignee: Hyundai Electronics Industries, Co., Ltd., Rep. of Korea

[21] Appl. No.: 774,824

[22] Filed: Dec. 27, 1996

[30] Foreign Application Priority Data

Dec. 29, 1995 [KR] Rep. of Korea .................. 95-66053

[51] Int. Cl.$^6$ .................................. H01L 21/336
[52] U.S. Cl. ..................... 438/289; 438/529; 438/965
[58] Field of Search .................... 438/217, 232, 438/289, 306, 529, 912, 965

[56] References Cited

U.S. PATENT DOCUMENTS

| | | | |
|---|---|---|---|
| 4,562,638 | 1/1986 | Schwabe et al. | 438/217 |
| 4,859,620 | 8/1989 | Wei et al. | 438/965 |
| 5,278,082 | 1/1994 | Kawamura | 438/289 |
| 5,301,084 | 4/1994 | Miller | 361/91 |
| 5,336,908 | 8/1994 | Roberts | 257/173 |
| 5,465,189 | 11/1995 | Polgreen et al. | 361/58 |
| 5,506,742 | 4/1996 | Marum | 361/56 |
| 5,523,250 | 6/1996 | Jeong et al. | 437/44 |
| 5,545,572 | 8/1996 | Lee et al. | 438/289 |

*Primary Examiner*—Chandra Chaudhari
*Attorney, Agent, or Firm*—Townsend and Townsend and Crew LLP

[57] ABSTRACT

A thin film transistor for an antistatic circuit includes: wells formed on a silicon substrate; insulating layers for electrical isolation between electrodes formed within the wells; low density impurity diffused regions respectively interposed between the insulating layers; a first high-density impurity diffused region formed within one low-density impurity diffused region; a second high-density impurity diffused region formed within the other low-density impurity diffused region; interlevel insulating layers formed on the insulating layers and the low-density impurity diffused layers; and metal gate electrodes formed on the low-density impurity diffused layers and the interlevel insulating layers; at least one of the first high-density impurity diffused region and the second high-density impurity diffused region being arranged to overlap an active region, inward from outside edges of the active region.

12 Claims, 10 Drawing Sheets

THIN FILM TRANSISTOR FOR ANTISTATIC CIRCUIT AND METHOD FOR FABRICATING THE SAME

BACKGROUND OF THE INVENTION

1. Field of the Invention

The present invention relates to an antistatic circuit. More particularly, it relates to a thin film transistor for an antistatic circuit of a semiconductor device which may prevent junction-leakage currents caused by electrostatic discharge (ESD), and further relates to a method for fabricating such a transistor.

2. Description of the Prior Art

The discharge of possibly several volts of static electricity occurs during IC handling even with proper precautions, and can damage the circuit sufficiently, causing immediate failure or damage to the device. Thus, much research and development have been devoted to methods for preventing electrostatic discharge (ESD) failures. An increase in leakage currents of input and output pads in field effect transistors, bipolar transistors, N+ spreading resistance, and n+ junction regions of active transistors adversely affect the reliability of semiconductor devices such as dynamic random access memories (DRAM), static random memories (SRAM), etc.

The junction leakage currents result from the concentration of electric fields on the region where the junction is formed, the junction failure created during As ion (n+ source/drain high density ion) implantation, and the loss of oxide films for sidewall spacers of gate electrodes caused by etching during the fabrication process of a lightly-doped drain structure (LDD) NMOS transistor.

A conventional antistatic circuit for a semiconductor device will be described referring to FIG. 1.

The conventional antistatic circuit of FIG. 1 includes a first field effect transistor FT11 and a second field effect transistor FT12 respectively coupled to supply voltage Vcc and ground Vss, a resistor Rs, and an active transistor AT11 (or NMOS gate diode).

A conventional antistatic circuit of FIG. 1B is realized through a first npn bipolar transistor BT11 and a second npn bipolar transistor BT12, rather than first field effect transistor FT11 and second field effect transistor FT12 and FIG. 1A's circuitry.

In the meantime, FIG. 1C's circuitry structure is substantially similar to that of FIG. 1B's antistatic circuit except that FIG. 1C's circuitry is realized through a third npn bipolar transistor BT13 having a base connected to ground Vss, rather than second npn bipolar transistor BT12 of FIG. 1B's circuitry.

An antistatic circuit of FIG. 2 includes a pull-up NMOS active transistor PU2 coupled with supply voltage Vcc and a pull-down NMOS active transistor PD2 coupled with ground Vss with respect to an output pad 21.

The following description relates to the circuitry structure of a conventional antistatic circuit. Attention is now invited to FIGS. 3A and 3B.

FIG. 3A is a schematic view of a field effect transistor for a conventional antistatic circuit, and shows active regions 30, N+ source/drain high-density impurity diffused regions 34, metal gate electrodes 36, and metal contacts 37.

Referring to FIG. 3B, the conventional field effect transistor includes wells 31 formed on a silicon substrate, insulating layers 32 for electrical isolation between electrodes formed in each first interior of well 31, low-density impurity diffused layers 33 respectively formed between insulating layers 32, N+ source/drain high-density diffused layers 33, interlevel insulating layers 35 formed on insulating layers 32 for electrical isolation between electrodes and low-density impurity diffused layers 33, and metal gate electrodes 36 formed on low-density impurity layers 33 and interlevel insulating layers 35.

The following description concerns a method for fabricating the above-mentioned field effect transistor for a conventional antistatic circuit.

As mentioned above, FIG. 3A is a schematic plane view of the field effect transistor, and FIG. 3B is a sectional view of the field effect transistor as taken along arrows A A' of FIG. 3A.

The steps in the manufacture of the field effect transistor begin with forming well 31 on a silicon substrate. Insulating layer 32 for electrical isolation between electrodes is grown within well 31 to form active region 30 and a region for electrical isolation between electrodes.

Low-density ions are implanted into both sides of insulating layer 32 for electrical isolation between electrodes to form low-density impurity diffused layer 33, and N+ source/drain high-density ions are implanted into low-density impurity diffused layer 33 to form N+ source/drain high-density impurity diffused region 34. Interlevel-insulating layer 35 and metal gate electrode 36 are formed on insulating layer 32 and low-density impurity diffused layer 33 in serial order.

Junctions created in regions A become weak through the above fabrication steps, and there is potential failure due to As ion implantation.

FIGS. 4A and 4B depict an active transistor for a conventional antistatic circuit.

FIG. 4A is a plane view of the active transistor for a conventional antistatic circuit, and illustrates an active region 60, an N+ source/drain high-density impurity diffused region 64, and a gate electrode 66.

FIG. 4B is a sectional view of the active transistor shown in FIG. 4A.

The conventional active transistor includes p-type wells 61 formed on a silicon substrate, insulating layers 62 for electrical isolation between electrodes formed within p-type wells 61, and a gate electrode 66 formed on insulating layer 62. The active transistor of FIG. 4B includes a low-density impurity diffused layer 63 interposed between insulating layers 62, an oxide film 65 for sidewall spacers formed on sidewalls of gate electrode 66 and insulating layer 62, and an N+ source/drain high-density impurity diffused region 64 formed in low-density impurity diffused layer 63.

The following description concerns a method for fabricating the above-mentioned active transistor for a conventional antistatic circuit.

Referring to FIGS. 4A and 4B, well 61 is formed on a silicon substrate, and insulating layer 62 for electrical isolation between electrodes is grown within well 61 to form active region 60 and a region for electrical isolation between electrodes. A gate oxide layer and gate electrode 66 are formed on insulating layer 62 in serial order.

Subsequently, low-density ions are implanted into both sides of insulating layer 62 for electrical isolation between electrodes to form low-density impurity diffused layer 63. Oxide film 65 for sidewall spacers is then formed on insulating layer 62 and gate electrode 66. As ions are implanted into low-density impurity diffused layer 63 to form N+ source/drain high-density impurity diffused region 64.

Junctions created in the regions A are weakened through As ion implantation, and a crossing of insulating layer 62 and gate electrode 66 is also deteriorated by As ion implantation to create region B.

SUMMARY OF THE INVENTION

Accordingly, the present invention is directed to a thin film transistor for an antistatic circuit of a semiconductor device that substantially obviates one or more of the problems due to limitations and disadvantages of the related art.

It is an object of the present invention to provide a thin film transistor for an antistatic circuit of a semiconductor device which can prevent junction leakage currents caused by electrostatic discharge (ESD).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor for an antistatic circuit of a semiconductor device includes wells formed on a silicon substrate; insulating layers for electrical isolation between electrodes formed within the wells; and low-density impurity diffused regions respectively interposed between the insulating layers. The inventive thin film transistor also includes a first high-density impurity diffused region formed within one low-density impurity diffused region; a second high-density impurity diffused region formed within the other low-density impurity diffused region; interlevel insulating layers formed on the insulating layers and the low-density impurity diffused layers; and metal gate electrodes formed on the low-density impurity diffused layers and the interlevel insulating layers. At least one of the above first high-density impurity diffused region and the second high-density impurity diffused region is arranged to overlap an active region, inward from outside edges of the active region.

According to a further aspect of the present invention, there is provided a thin film transistor for an antistatic circuit including: wells formed on a silicon substrate; insulating layers for electrical isolation between electrodes formed within the wells; gate electrodes formed on the interlevel insulating layers; and oxide films for gate sidewall spacers respectively formed on the insulating layer and sidewalls of the gate electrodes. The inventive thin film transistor also includes a first high-density impurity diffused region formed within one low density impurity diffused region; and a second high-density impurity diffused region formed within the other low-density impurity diffused region. Of the high-density impurity diffused region; the second high-density impurity diffused region; a crossing of the first high-density impurity diffused region and the gate electrode; a crossing of the second high-density impurity diffused region and the gate electrode; a crossing of the first high-density impurity diffused region, the gate electrode and the insulating layer; a crossing of the second high-density impurity diffused region, the gate electrode and the insulating layer; a corner where the first high-density impurity diffused region and gate electrode cross each other; a corner where the second source high-density impurity diffused region and the gate electrode cross each other; a corner where the first high-density impurity diffused region, the gate electrode and the insulating layer cross one another; and a corner where the second high-density impurity diffused region, the gate electrode and the insulating layer cross one another, at least one is arranged to overlap the active region, inward from outside edges of the active region.

According to yet a further aspect of the present invention, a method for fabricating a thin film transistor including the steps of forming a well on a silicon substrate and growing an insulating layer for electrical isolation between electrodes within the well to form an active region and a region for electrical isolation between electrodes; implanting low-density ions into both sides of the insulating layer for electrical isolation between electrodes to form a low-density impurity diffused region; implanting high-density ions into the low-density impurity diffused region to form first and second high density impurity diffused regions so that at least one of the first and second high-density impurity regions can be arranged to overlap the active region, inward from outside edges of the active region; and forming an interlevel insulating layer and a metal gate electrode on the insulating layer and low-density impurity diffused layer in serial order.

According to yet a further aspect of the present invention, there is disclosed a method for fabricating a thin film transistor including the steps of forming a well on a silicon substrate and growing an insulating layer for electrical isolation between electrodes within the well to form an active region and a region for electrical isolation between electrodes; forming a gate electrode on the insulating layer; implanting low-density ions into both sides of the insulating layer for electrical isolation between electrodes to form a low-density impurity diffused region; forming an oxide film for sidewall spacers on the insulating layer and sidewalls of gate electrode; and implanting high-density ions into the low-density impurity diffused region to form first and second high-density impurity diffused regions so that at least one of the first and second high-density impurity diffused regions can be arranged to overlap the active region, inward from outside edges of the active region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to a preferred embodiment of the present invention, examples of which are illustrated in the accompanying drawings.

Figure 5A:
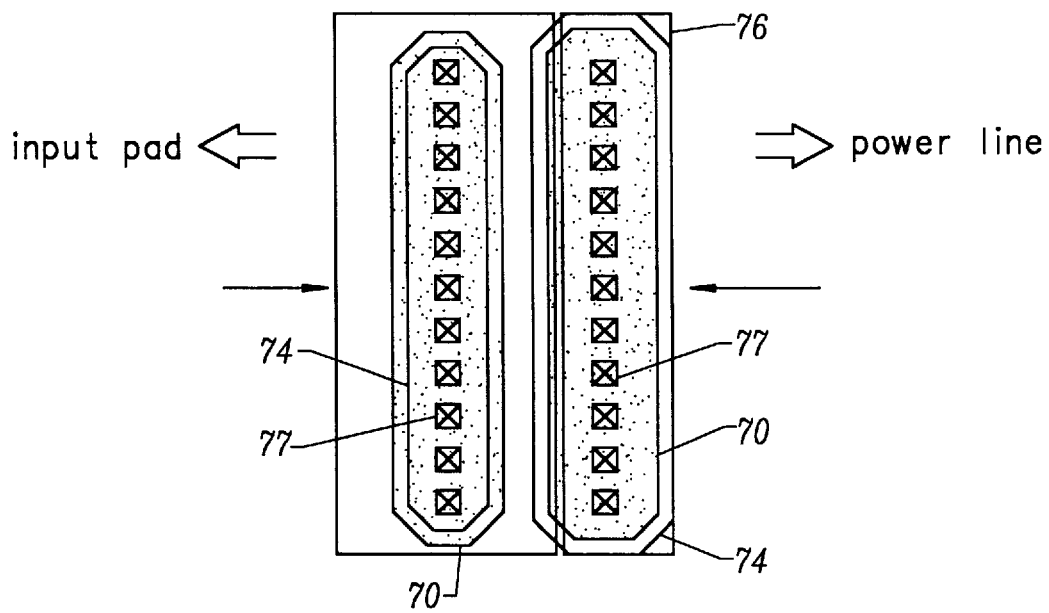
FIGS. 5A and 5B are each plane views of metal gate NMOS field effect transistors for an antistatic circuit in accordance with the present invention.
Figure 5B:
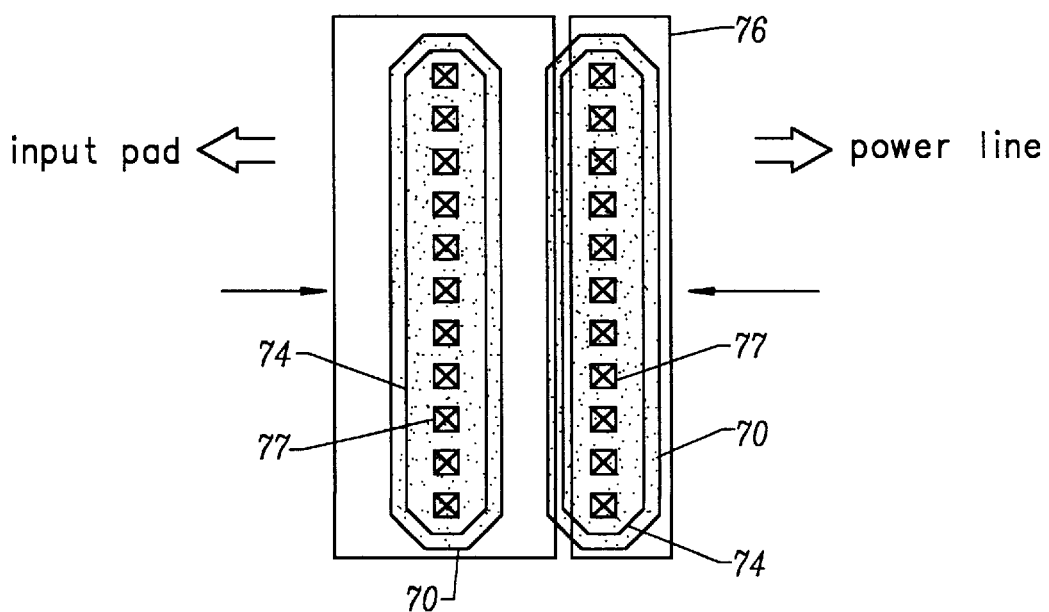

FIGS. 5A and 5B are plane views of metal gate NMOS field effect transistors for an antistatic circuit in accordance with the present invention.

The transistor of FIG. 5A includes active regions 70, N+ source/drain high-density impurity diffused regions 74 whose portion connected to an input pad overlaps the inside of active region 70, metal gate electrodes 76, and metal contacts 77.

FIG. 5B is a plane view of a metal gate NMOS field effect transistor for an antistatic circuit in accordance with the present invention. FIG. 5B's transistor is substantially similar to FIG. 7A's in structure except that a junction connected to power lines Vcc and Vss overlaps the inside of active region 70.

Figure 5C:
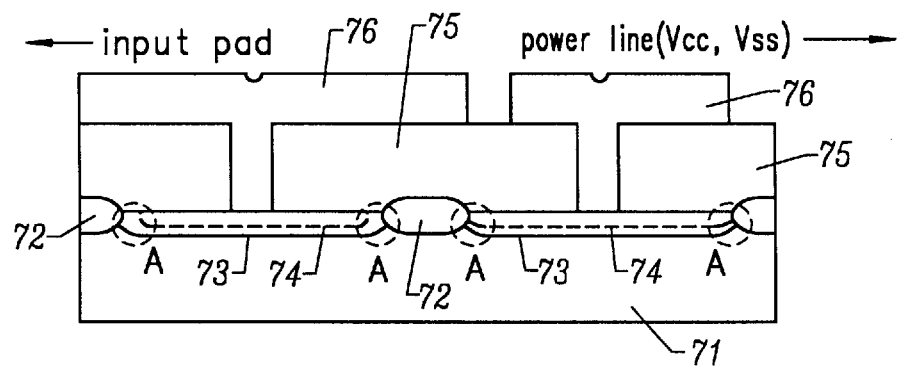
FIG. 5C is a sectional view of the metal gate NMOS field effect transistors of FIGS. 5A and 5B.

FIG. 5C is a sectional view of the metal gate NMOS field effect transistors of FIGS. 5A and 5B.

The inventive field effect transistor includes wells 71 formed on a silicon substrate, insulating layers 72 for electrical isolation between electrodes formed within wells 71, and low-density impurity diffused layers 73 respectively interposed between insulating layers 72. The transistor of FIG. 5C also includes an N+ drain high-density impurity diffused region 74 formed in low-density impurity diffused layer 73, inward from the outside edges of active region 70, an N+ source high-density impurity diffused region 74 formed within low-density impurity diffused layer 73, interlevel insulating layere 75 formed on insulating layers 72 and low-density impurity diffused layers 73, and gate electrodes 76 formed on low-density impurity diffused layers 73 and interlevel insulating layers 75. N+ drain high density impurity diffused region 74 is arranged to overlap active region 70 by 0.1 µm or more.

The following description concerns a method for fabricating the above-mentioned field effect transistor for an antistatic circuit.

Referring to FIGS. 5A to 5C, well 71 is formed on a silicon substrate, and insulating layer 72 for electrical isolation between electrodes is grown within well 71 to form active region 70 and a region for electrical isolation between electrodes.

Subsequently, low-density ions are implanted into both sides of insulating layer 72 for electrical isolation between electrodes to form low-density impurity diffused layer 73. As ions of high density are implanted into low-density impurity diffused layer 73 to form N+ drain/source high-density impurity diffused regions 74 so that either the drain region or the source region can be in low-density impurity diffused layer 73, inward from the outside edges of ac region 70. Interlevel insulating layer 75 and metal gate electrode 76 are formed on insulating layer 72 and low-density impurity diffused layer 73.

Figure 6A:
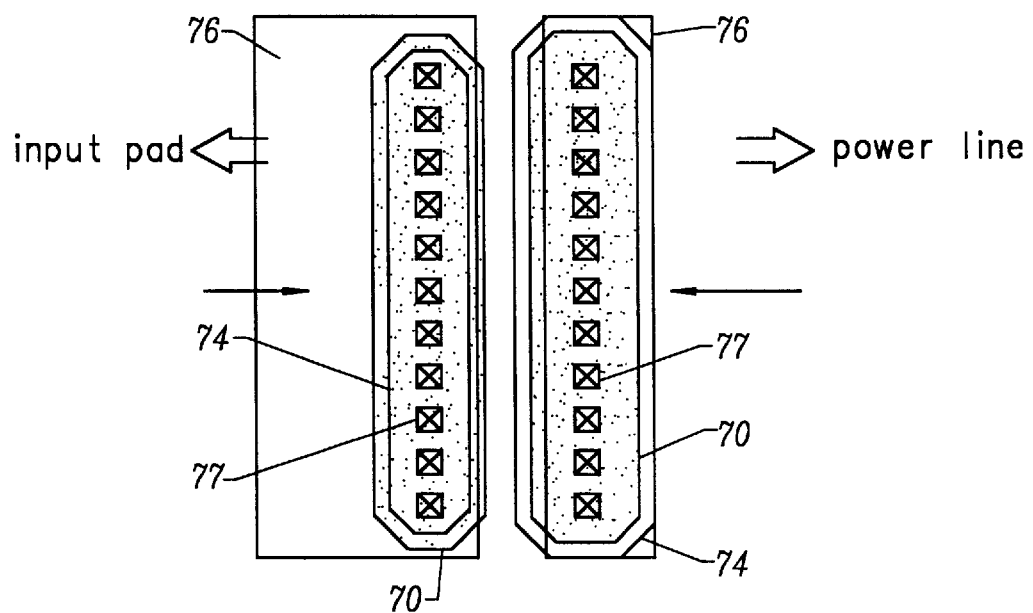
FIGS. 6A and 6B are each plane views of bipolar transistors for an antistatic circuit in accordance with the present invention.
Figure 6B:
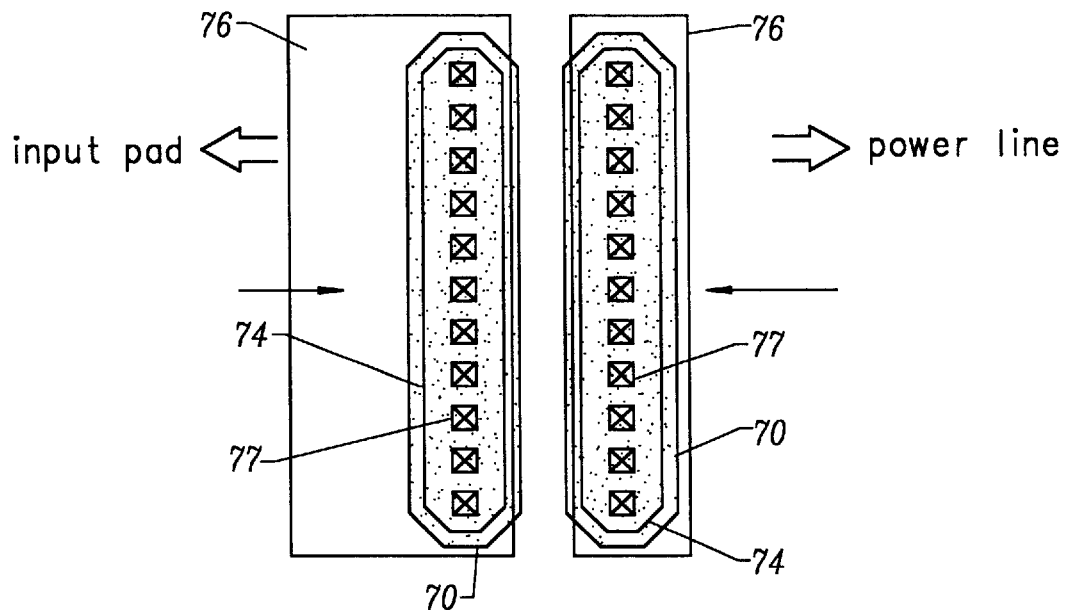

FIGS. 6A and 6B are plane views of bipolar transistors for an antistatic circuit in accordance with the present invention. The bipolar transistors of FIGS. 6A and 6B are substantially identical to FIGS. 5A and 5B in structure except that they are realized through gate electrodes rather than metal gate electrodes 76 of FIGS. 5A and 5B.

Figure 7:
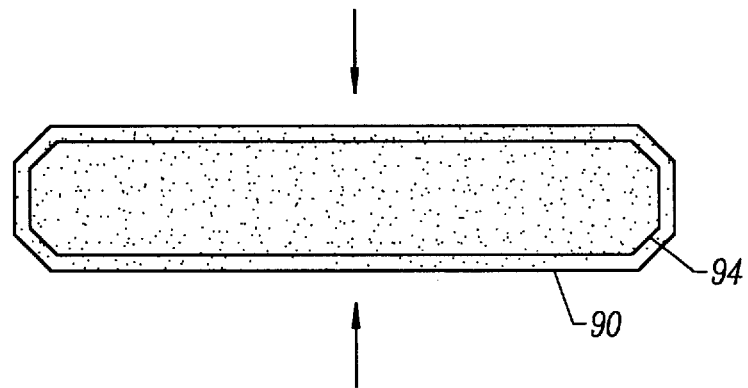
FIG. 7 is a plane view of a resistor for the inventive antistatic circuit.

FIG. 7 is a plane view of a resistor for the inventive antistatic circuit. The resistor consists of an active region 90 and an N+ source/drain high-density impurity diffused region that overlap each other.

Figure 8A:
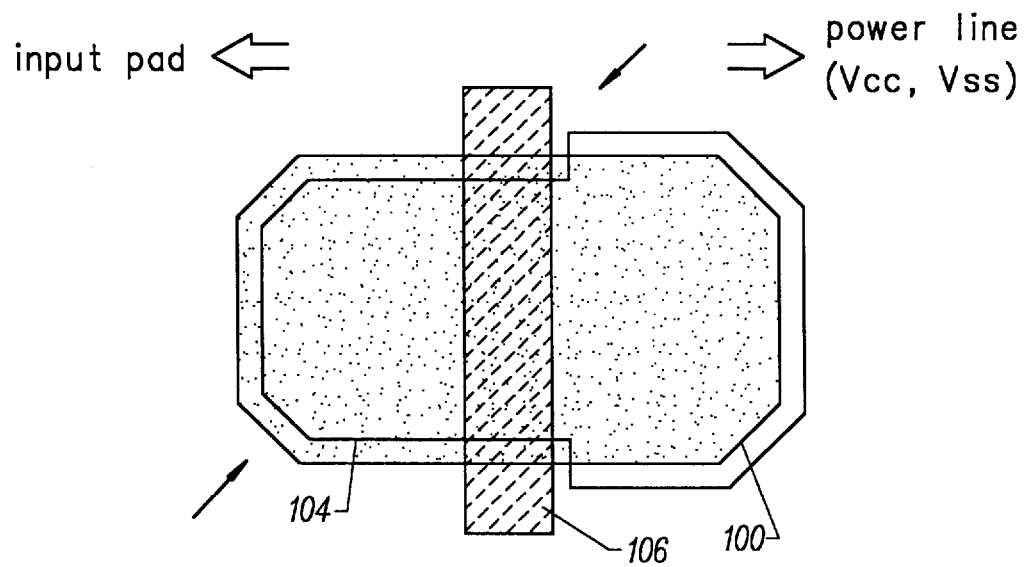
FIGS. 8A to 8E are each plane views of an active transistor for an antistatic circuit in accordance with the present invention.

FIG. 8A is a plane view of an active NMOS transistor for an antistatic circuit in accordance with a preferred embodiment of the present invention. The active NMOS transistor includes an active region 100, N+ source/drain high-density impurity diffused region 104 formed to overlap active region 100, and a gate electrode 106. According to the features of this active NMOS transistor, the overlap is created on an N+ diffused junction, a crossing of gate electrode 106 and high density diffused region 104, and a crossing of the source/drain's active region, gate electrode 106, and a region for electrical isolation.

Figure 8B:
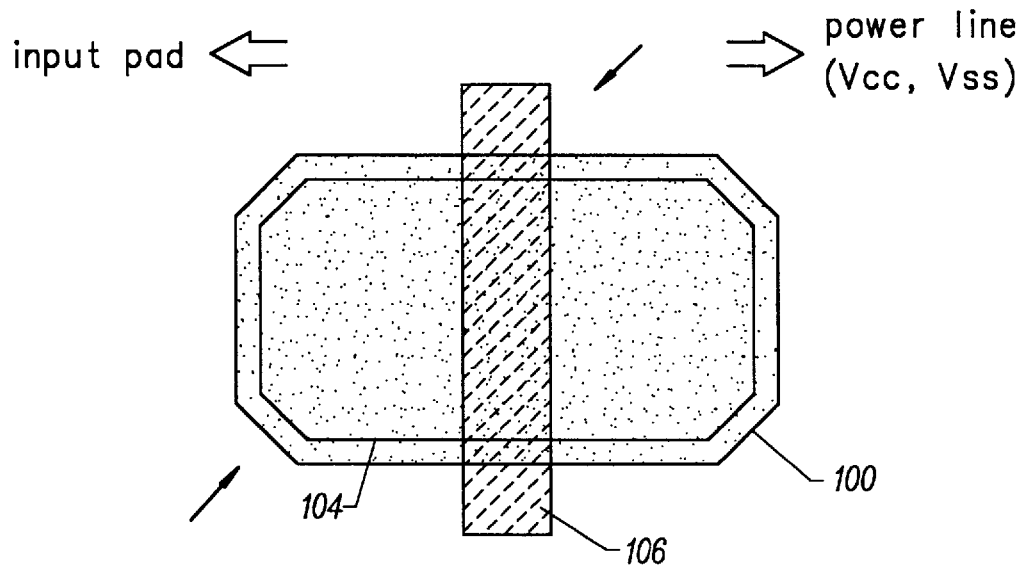

FIG. 8B is a plane view of an active transistor for an antistatic circuit in accordance with a further preferred embodiment of the present invention. An N+ source/drain high-density impurity diffused region 104 is arranged to overlap an active region 100 on an N+ diffused junction of source/drain's active region connected to input/output pads and a crossing of a gate electrode 106 and N+ source/drain high-density impurity diffused region 104.

Figure 8C:
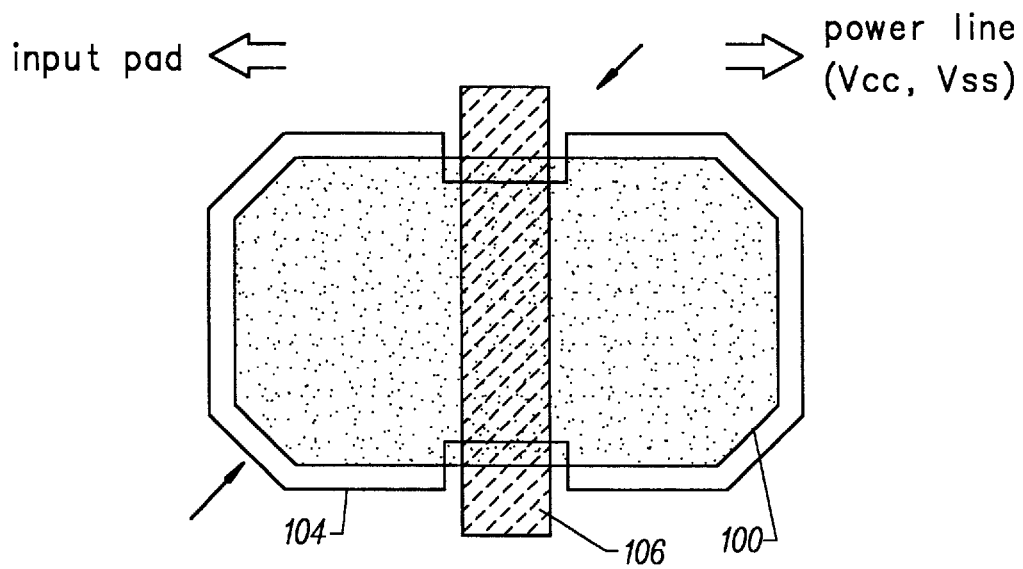

FIG. 8C is a plane view of an active transistor for a antistatic circuit in accordance with yet a further preferred embodiment of the present invention. An N+ source/drain high-density impurity diffused region 104 is arranged to overlap an active region 100 on source/drain's active region connected to input/output pads and outside edges where a gate electrode 106 and insulating layer 102 cross each other.

Figure 8D:
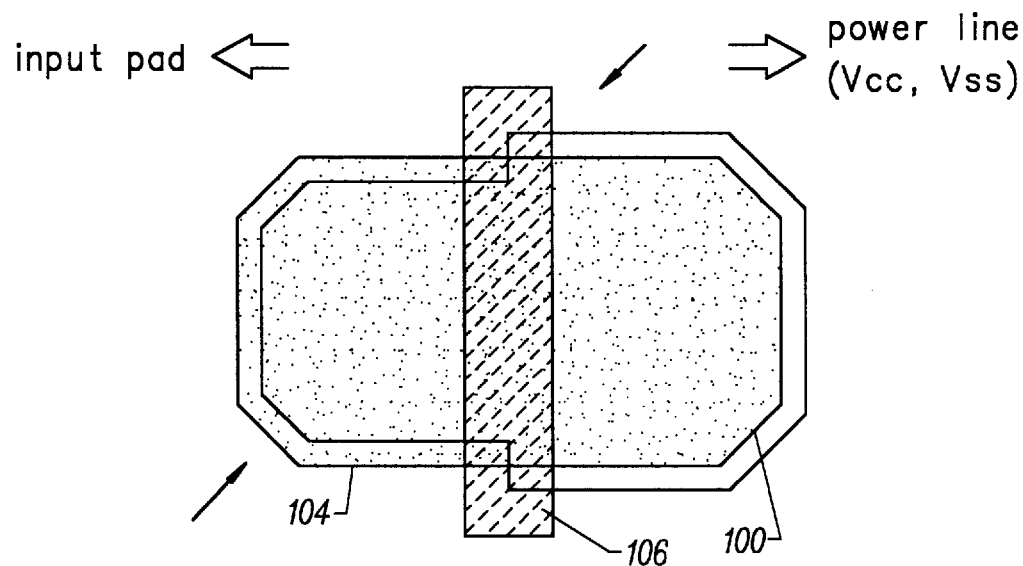

FIG. 8D is a plane view of an active transistor for an antistatic circuit in accordance with yet a further preferred embodiment of the present invention. An N+ source/drain high-density impurity diffused region 104 is arranged to overlap an active region 100 on the source/drain's active region connected to input/output pads and a cornering where a gate electrode 106 and an active region 100 connected to pads cross each other.

Figure 8E:
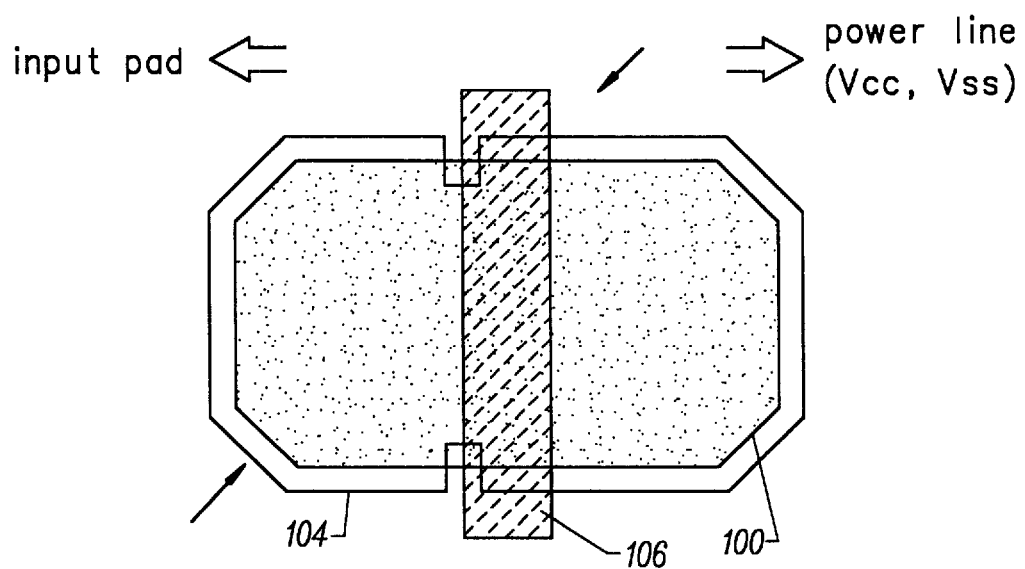

FIG. 8E is a plane view of an active transistor for an antistatic circuit in accordance with yet a further preferred embodiment of the present invention. An N+ source/drain high-density impurity diffused region 104 is arranged to overlap an active region 100 on an active region connected to input/output pads, a crossing where a gate electrode 106 and N+ source/drain high-density impurity diffused region 104 cross each other.

The active NMOS transistor of the present invention includes p-type wells 101 formed on a silicon substrate, insulating layers 102 for electrical isolation between electrodes formed within wells 101, and a gate electrode 106 formed on insulating layer 102. The active NMOS transistor also includes a low-density impurity diffused region 103 interposed between insulating layers 102, an oxide film 105 for sidewall spacers formed on insulating layer 102 and sidewalls of gate electrode 106, an N+ drain high-density impurity diffused region 104 formed within low-density impurity diffused layer 103, an N+ source high-density impurity diffused region 1041 formed within low-density impurity diffused region 103.

There are N+ drain high-density impurity diffused region 104; N+ source high-density impurity diffused region 1041; a crossing of N+ drain high-density impurity diffused region 104 and gate electrode 106; a crossing of N+ source high-density impurity diffused region 1041 and gate electrode 106; a crossing of N+ drain high-density impurity diffused region 104, gate electrode 106 and insulating layer 102; a crossing of N+ source high-density impurity diffused region 1041, gate electrode 106 and insulating layer 102; a corner where N+ drain high-density impurity diffused region 104 and gate electrode 106 cross each other; a corner where N+ source high-density impurity diffused region 1041 and gate electrode 106 cross each other; a corner where N+ drain high-density impurity diffused region 104, gate electrode 106 and insulating layer 102 cross one another; and a corner where N+ source high-density impurity diffused region 1041, gate electrode 106 and insulating layer 102 cross one another. At least one of the above areas overlaps active region 100, inward from the outside edges of active region 100. N+ source/drain high-density impurity diffused regions 104 and 1041 overlap active region 100 by 0.1 $\mu$m or more.

The following description relates to the steps in the manufacture of the above-mentioned active transistor for an antistatic circuit in accordance with the present invention.

Well 101 is formed on a silicon substrate, and insulating layer 102 for electrical isolation between electrodes is grown within well 101 to form an active region and a region for electrical separation. A gate oxide layer and gate electrode 106 are formed on insulating layer 102 in serial order.

Subsequently, low-density P ions are implanted into both sides of insulating layer 102 for electrical isolation between electrodes to form low-density impurity diffused layer 103. An oxide film 105 for sidewall spacers is formed on insulating layer 102 and sidewalls of gate electrode 106. As ions are then implanted into low-density impurity diffused layer 103 to form N+ source/drain high-density impurity diffused regions 104 and 1041 so that of N+ drain high-density impurity diffused region 104; N+ source high diffused region 1041; a crossing of N+ drain high density impurity diffused region 104 and gate electrode 106; a crossing of N+ source high-density impurity diffused region 1041 and gate electrode 106; a crossing of N+ drain high-density impurity diffused region 104, gate electrode 106 and insulating layer 102; a crossing of N+ source high-density impurity diffused region 1041, gate electrode 106 and insulating layer 102; a corner where N+ drain high-density impurity diffused region 104 and gate electrode 106 cross each other; a corner where N+ source high density impurity diffused region 1041 and gate electrode 106 cross each other; a corner where N+ drain high-density impurity diffused region 104, gate electrode 106 and insulating layer 102 cross one another; and a corner where N+ source high-density impurity diffused region 1041, gate electrode 106 and insulating layer 102 cross one another, at least one overlaps active region 100, inward from the outside edges of active region 100.

As discussed above, the inventive thin film transistor for an antistatic circuit and the method for fabricating such a transistor may ensure the enhancement of electrostatic discharge characteristics by minimizing junction leakage currents caused by electrostatic discharge (ESD).

It will be apparent to those skilled in the art that various modifications and variations can be made in a contact opening test for a semiconductor device of the present invention without departing from the spirit or scope of the invention. Thus, it is intended that the present invention cover the modifications and variations of this invention provided that they are within the scope of the appended claims and their equivalents.

What is claimed is:

1. A method for fabricating a thin film transistor comprising the steps of:

forming a well on a silicon substrate and growing an insulating layer for electrical isolation between electrodes within said well to form an active region and a region for electrical isolation between electrodes;

implanting low-density ions into both sides of said insulating layer for electrical isolation between electrodes to form a low-density impurity diffused region;

implanting high-density ions into said low-density impurity diffused region to form first and second high-density impurity diffused regions so that at least one of said first and second high-density impurity diffused regions can be arranged to overlap said active region, inward from outside edges of said active region; and forming an interlevel insulating layer and a metal gate electrode on said insulating layer and low-density impurity diffused layer in serial order.

2. A method according to claim 1, wherein said high-density ions are As ions.

3. A method for fabricating a thin film transistor comprising the steps of:

forming a well on a silicon substrate and growing an insulating layer for electrical isolation between electrodes within said well to form an active region and a region for electrical isolation between electrodes;

forming a gate electrode on said insulating layer;

implanting low-density ions into both sides of said insulating layer for electrical isolation between electrodes to form a low-density impurity diffused region;

forming an oxide film for sidewall spacers on said insulating layer and sidewalls of said gate electrode; and implanting high-density ions into said low-density impurity diffused region to form first and second high-density impurity diffused regions so that at least one of said first and second high density impurity diffused regions can be arranged to overlap said active region, inward from outside edges of said active region.

4. A method according to claim 3, wherein said high-density ions are As ions.

5. The method of claim 1 wherein the transistor is in an antistatic device.

6. The method of claim 1 wherein said one of said first and second high density impurity diffused region overlaps said active region by a given distance.

7. The method of claim 6 wherein the given distance is at least 0.1 $\mu$m.

8. The method of claim 1 wherein the gate electrode separates the first and second high-density impurity diffused regions.

9. The method of claim 3 wherein the transistor is in an antistatic device.

10. The method of claim 3 wherein said one of said first and second high density impurity diffused region overlaps said active region by a given distance.

11. The method of claim 10 wherein the given distance is at least 0.1 $\mu$m.

12. The method of claim 3 wherein the gate electrode separates the first and second high-density impurity diffused regions.

* * * * *

UNITED STATES PATENT AND TRADEMARK OFFICE
CERTIFICATE OF CORRECTION

PATENT NO. : 5,807,728
DATED : September 15, 1998
INVENTOR(S) : Jae Goan Jeong and Gun Woo Park It is certified that error appears in the above-identified patent and that said Letters Patent is hereby corrected as shown below:

Title page,
Item [75], Inventors, after "Jae Goan Jeong; Gun Woo Park, both of Ichon-shi." please insert -- Kyoungki-do --.

Figure 1A:
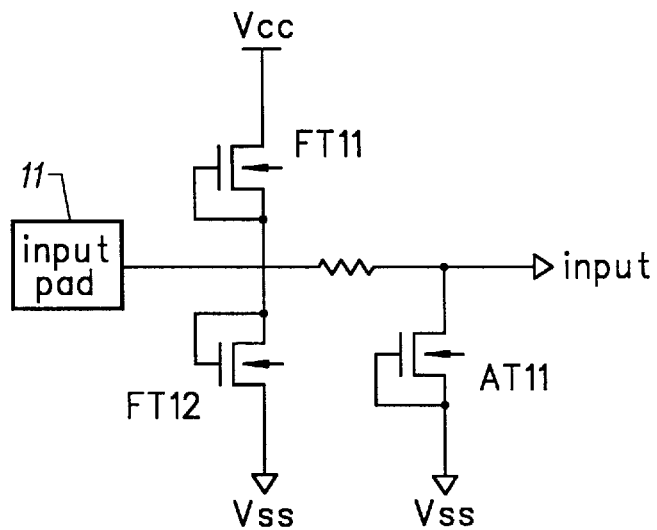
FIGS. 1A to 1C are each circuit diagrams of conventional antistatic circuits with respect to their respective input pads.
Figure 1B:
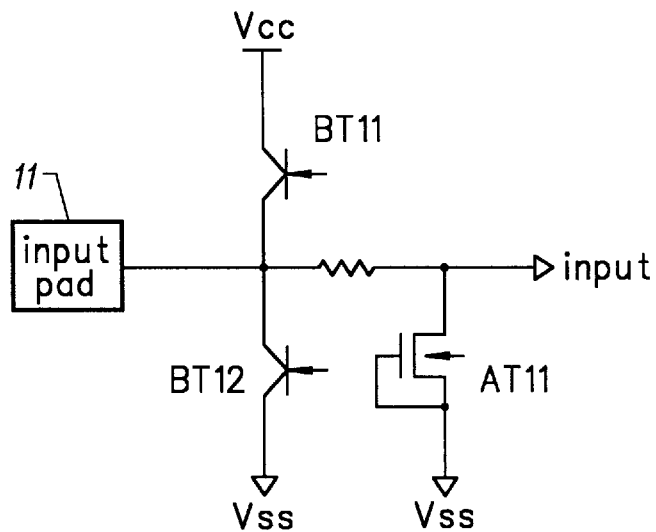
Figure 1C:
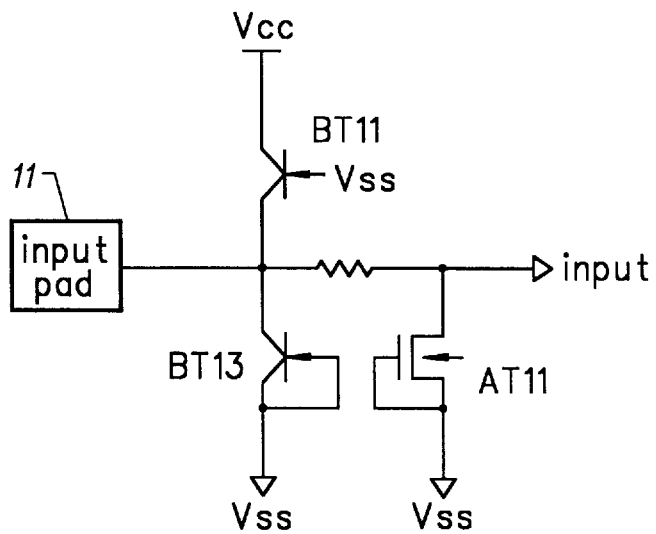
Figure 2:
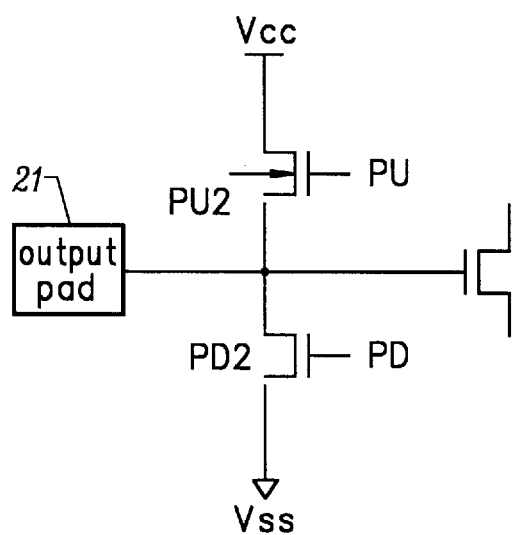
FIG. 2 is a circuit diagram of conventional antistatic circuits with respect to their respective output pads.

Drawings,
Sheet 1, Fig. 1A, the reference letters Rs should be applied to the resistor. The resistor Rs should appear as follows:

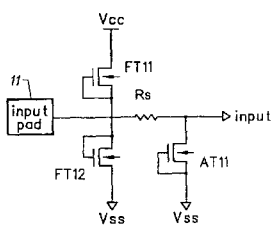

FIG. 1A
(prior art)

Figure 3A:
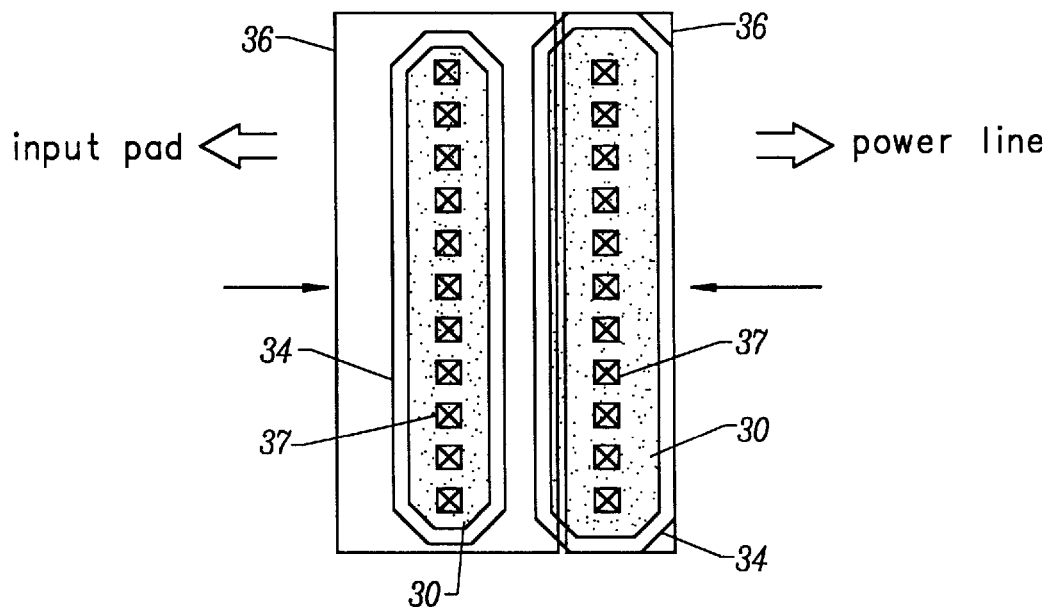
FIG. 3A is a schematic plane view of a field effect transistor for a conventional antistatic circuit.
Figure 3B:
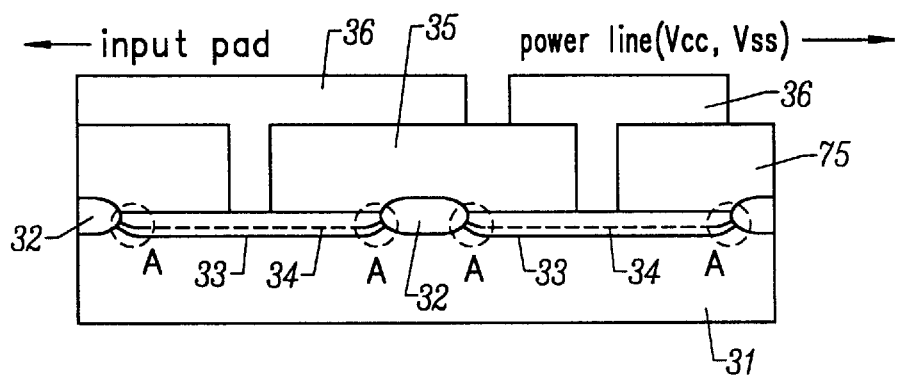
FIG. 3B is a sectional view of the field effect transistor as taken along arrows A–A' of FIG. 3A.
Figure 4A:
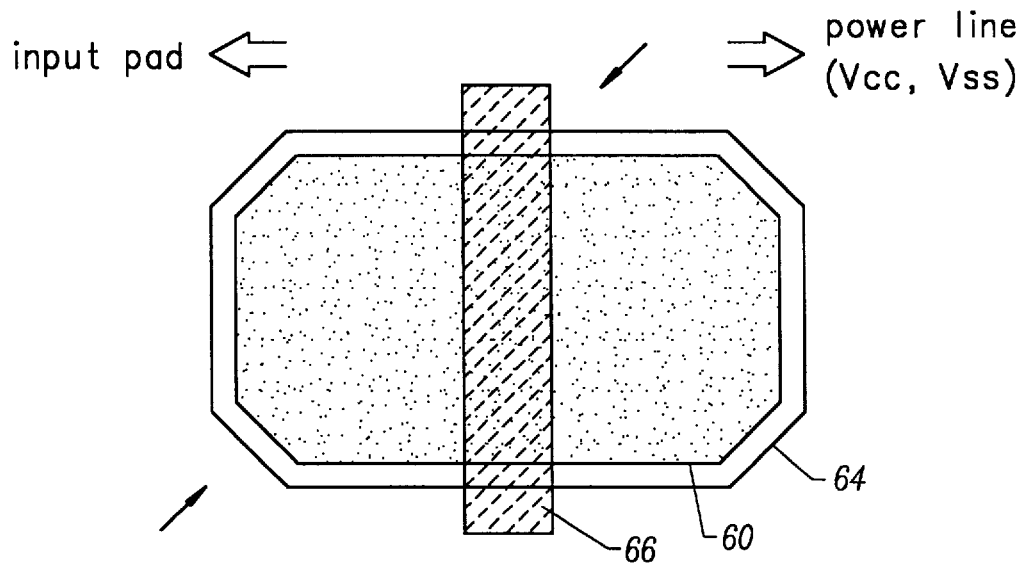
FIG. 4A is a plane view of the active transistor for a conventional antistatic circuit.
Figure 4B:
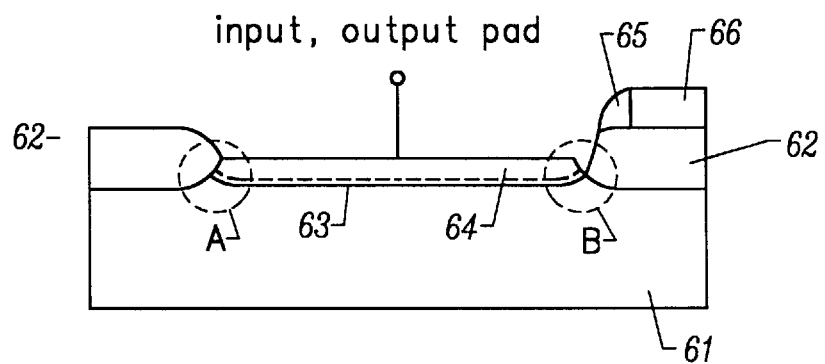
FIG. 4B is a sectional view of the active transistor of FIG. 4A.

Sheet 3, Fig. 3A, the reference letters A and A' should be applied to the arrows along the field effect transistor. The arrows AA' should appear as follows:

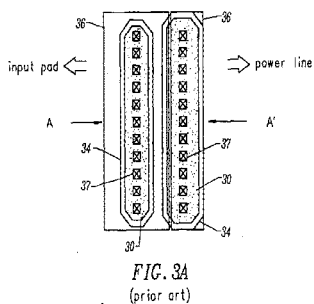

FIG. 3A
(prior art)

Sheet 8, Fig. 8A, the reference letters A and A' should be applied to the arrows along the transistor. The arrows A-A' should appear as follows:

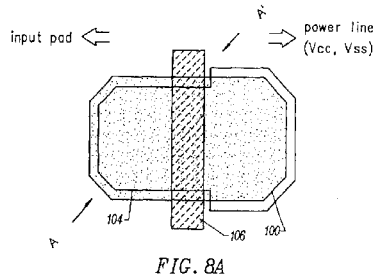

FIG. 8A

UNITED STATES PATENT AND TRADEMARK OFFICE
CERTIFICATE OF CORRECTION

Figure 8F:
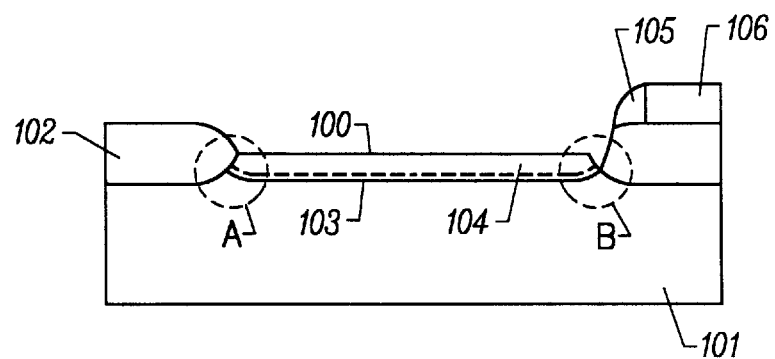
FIG. 8F is a sectional view of the active transistor as taken along arrows A–A' of FIG. 8A.

PATENT NO. : 5,807,728
DATED : September 15, 1998
INVENTOR(S) : Jae Goan Jeong and Gun Woo Park It is certified that error appears in the above-identified patent and that said Letters Patent is hereby corrected as shown below:

Drawings (cont'd),
Sheet 10, Fig. 8F, should be replaced with the figure below:

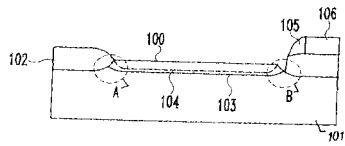

Fig. 8F

Column 3,
Line 54, after "the" (second occurrence), insert -- first --.
Line 65, delete "source".

Column 6,
Line 1, change "ac" to -- active --.
Line 47, change "cornering" to -- corner --.

Column 7,
Lines 2, 5, 8, 12, 15, 20, 24, 39, 41, 50 and 55, change "1041" to -- 104 --.

Signed and Sealed this

Seventeenth Day of August, 2004

JON W. DUDAS
*Acting Director of the United States Patent and Trademark Office*